(12) United States Patent
Takahashi et al.

(10) Patent No.: US 8,829,890 B2
(45) Date of Patent: Sep. 9, 2014

(54) OPTICAL VOLTAGE SENSOR

(75) Inventors: Masao Takahashi, Fujisawa (JP);
Junichi Sato, Kunitachi (JP); Takashi Miyabe, Kawasaki (JP); Tokihiro Umemura, Mie-gun Mie (JP); Tsuyoshi Kuwabara, Mie-gun Mie (JP)

(73) Assignees: Kabushiki Kaisha Toshiba, Tokyo (JP); Toshiba Industrial Products Manufacturing Corporation, Asahi-cho, Mie-gun, Mie (JP)

( * ) Notice: Subject to any disclaimer, the term of this patent is extended or adjusted under 35 U.S.C. 154(b) by 544 days.

(21) Appl. No.: 12/994,701

(22) PCT Filed: May 27, 2009

(86) PCT No.: PCT/JP2009/059661
§ 371 (c)(1),
(2), (4) Date: Jun. 2, 2011

(87) PCT Pub. No.: WO2009/145214
PCT Pub. Date: Dec. 3, 2009

(65) Prior Publication Data
US 2011/0234202 A1   Sep. 29, 2011

(30) Foreign Application Priority Data

May 28, 2008   (JP) ................................ P2008-139988

(51) Int. Cl.
*G01R 31/00* (2006.01)
(52) U.S. Cl.
USPC .............................................. 324/96; 324/97
(58) Field of Classification Search
USPC ........................................................... 324/96
See application file for complete search history.

(56) References Cited

U.S. PATENT DOCUMENTS

| 4,631,402 | A  | * | 12/1986 | Nagatsuma et al. | ........ 250/231.1 |
| 5,731,579 | A  | * | 3/1998 | Woods | ...................... 250/227.17 |
| 6,411,077 | B1 | * | 6/2002 | Sone et al. | ........................ 324/96 |
| 6,798,960 | B2 | * | 9/2004 | Hamada | ........................ 385/122 |

FOREIGN PATENT DOCUMENTS

| CN | 2510871 | 9/2002 |
| GB | 439049 | 11/1935 |
| JP | 60-210770 | 10/1985 |

(Continued)

OTHER PUBLICATIONS

Takahashi, JP2003-014790, JPO Machine Translation, p. 1-11.*

(Continued)

*Primary Examiner* — Thomas F Valone
(74) *Attorney, Agent, or Firm* — Finnegan, Henderson, Farabow, Garrett & Dunner, L.L.P.

(57) ABSTRACT

A polarizing optical system (15, 16) is disposed perpendicular to an optical axis of incoming light from a light source (12), having the optical axis (12) as a center axis, and configured for polarization of incoming light to a prescribed reference state, an electro-optical device (17) is disposed perpendicular to the optical axis, having the optical axis as a center axis, and adapted, as a voltage to be measured is imposed thereon, to respond to the imposed voltage by polarizing light polarized by the polarizing optical system (15, 16), and an analyzer (18) is disposed perpendicular to the optical axis, having the optical axis as a center axis, and adapted for detection of light polarized by the electro-optical device (17), to irradiate a detector (21) configured for conversion of incoming light into an electric signal.

2 Claims, 6 Drawing Sheets

(56) References Cited

FOREIGN PATENT DOCUMENTS

| JP | 8-146047 | 6/1996 |
|---|---|---|
| JP | 2003-14790 | 1/2003 |
| JP | 2005-315815 | 11/2005 |

OTHER PUBLICATIONS

Kanai, JP60-210770, PTO Human Translation, p. 1-8.*
Hidaka, JP2005-315815, JPO Machine Translation, p. 1-13.*
First Office Action issued by the State Intellectual Property Office of the People's Republic of China on Oct. 18, 2012, for Chinese Patent Application No. 200980118555.3, and English-language translation thereof.
Notice of Reasons for Refusal issued by the Japanese Patent Office on Dec. 11, 2012, for Japanese Patent Application No. 2008-139988, and English-language translation thereof.
Notification of Reasons for Refusal issued by the Korean Intellectual Property Office on Feb. 7, 2012, for Korean Patent Application No. 10-2010-7025208, and English-language translation thereof.
International Search Report from Japanese Patent Office for International Application No. PCT/JP2009/059661, Mailed Aug. 11, 2009.
Decision of Rejection issued by the Japanese Patent Office on Oct. 15, 2013, for Japanese Patent Application No. 2008-139988, and English-language translation thereof.
Second Office Action issued by the State Intellectual Property Office of the People's Republic of China on May 28, 2013, for Chinese Patent Application No. 200980118555.3, and English-language translation thereof.
Official Action issued by the Canadian Intellectual Property Office on Apr. 8, 2013, for Canadian Patent Application No. 2,724,859.
Extended European Search Report issued by the European Patent Office on May 16, 2014, for European Patent Application No. 09754722.8.
Decision of Rejection issued by the State Intellectual Property Office of the People's Republic of China on May 5, 2014, for Chinese Patent Application No. 200980118555.3, and English-language translation thereof.

* cited by examiner

OPTICAL VOLTAGE SENSOR

TECHNICAL FIELD

The present invention relates to an optical voltage sensor having applications to optical voltage measuring apparatuses adapted for use of light to measure an electric voltage.

BACKGROUND ART

There are large magnetic fields developed around, among others, power equipments or power lines, such as in power plants or substations. In such power plants, substations, or the like, making use of an electric signal for precise measurement of voltage or current sometimes leads to a failure due to influences of surrounding magnetic fields. To this point, there have since ever been techniques for measurements of voltage or current by use of an optical signal free of influences of magnetic fields (ex. refer to patent document 1).

There will be brief on an apparatus adapted for optical measurement of voltage (optical voltage measuring apparatus) with reference to FIG. 1. FIG. 1 illustrates an optical voltage measuring apparatus 2, which includes a light source driver 11 under control to have a light source 12 emit flux of light, which is conducted through an optical fiber 13a to a light sending collimator 14. The light sending collimator 14 changes incoming light from the optical fiber 13a into parallel light, to send to a polarizer 15. At the polarizer 15, incoming light from the light sending collimator 14 is linear polarized, and at a retardation plate 16, linear polarized light from the polarizer 15 is circular polarized, to provide reference light. There is a voltage imposed as a target of measurement on an electro-optical device 17. The electro-optical device 17 is configured to polarize incoming light from the retardation film 16, in accordance with an electro-optical effect due to the imposed voltage 17a. Polarized light from the electro-optical device 17 is received by an analyzer 18, and a light receiving collimator 19 changes incoming light from the analyzer 18 into parallel light, to conduct through an optical fiber 13b. This involves an optical signal to be detected through the optical fiber 13b, which is converted by a detector 21 into an electric signal. Afterwards, the electric signal after conversion by the detector 21 is processed by a voltage measurer 22 for calculation of the voltage to be measured.

In order for the optical voltage measuring apparatus 2 to implement measurements with high precision, the polarizer 15, retardation plate 16, electro-optical device 17, and analyzer 18 should have stable polarized light. However, the devices 15-18 have photoelastic effects due to vibrations, the photoelastic effects disturbing polarized status. On the other hand, as an object of voltage measurement by the optical voltage measuring apparatus 2, the power equipment or the like may be high voltage equipment that may undergo large vibrations in an environment in which the optical voltage measuring apparatus 2 would be installed. For instance, the high voltage equipment has a breaker for current interruption upon occurrence of anomaly, the breaker being set to turn on and off, producing vibrations exceeding 1,000 G. The optical voltage measuring apparatus 2 might have been installed under a condition that would produce such large vibrations, constituting a difficulty to provide a stable polarized status.

There has been a known anti-vibratory measure including, as illustrated in FIG. 1, the devices 14 to 19 arranged on a base plate 25, with an elastic body in between, the elastic body absorbing vibrations to prevent the devices from being vibrated.

Referring now to FIGS. 2 to 4, there will be described an adhesion method of the electro-optical device 17, together with problems due to vibrations. The description addresses a case of the electro-optical device 17, while the other devices 14 to 16, 18, and 19 also are each adhesive bonded to the base plate 25 in a similar manner, with a similar problem.

As illustrated in FIG. 2(a), the electro-optical device 17 is adhesion-bonded through an elastic body 23 onto the base plate 25. In a state of the base plate 25 being given no external vibrations, as illustrated in FIG. 2(a), the electro-optical device 17 is kept parallel to the base plate 25. On the other hand, if the base plate 25 is given a vibration, as illustrated in FIG. 2(b), the electro-optical device 17 is caused to incline relative to the base plate 25, by inertial forces acting on the electro-optical device 17.

In the state given no vibrations, as illustrated in FIG. 3(a), the electro-optical device 17 has an attitude perpendicular to an optical axis L. When the electro-optical device 17 is in the attitude perpendicular to the optical axis L, outgoing light travels, striking into an opening 19a of the light receiving collimator 19 in a prescribed position, so the light receiving collimator 19 is adapted for detection of light.

On the other hand, if given an external vibration, the electro-optical device 17 has an inclination, and as illustrated in FIG. 3(b), the electro-optical device 17 has an angular deviation. That is, there is an angular deviation δ developed between an optical axis L1 of incoming light and an optical axis L2 of outgoing light, so outgoing light is unable to strike into the opening 19a. Hence, the light receiving collimator 19 fails in detection of light, as a problem. Such a failure in detection of light at the light receiving collimator 19 makes it unclear to determine if the failure in detection of light is derived from a polarization of light by a voltage to be measured, or if the failure in detection of light is derived from any angular deviation by vibration at a device such as the electro-optical device 17, with a resultant failure in voltage measurement to be accurate.

Such being the case, in regard of the electro-optical device 17's inclination due to vibration, the degree became greater as the adhesive 23 had an increased thickness, as a problem. Therefore, the adhesive 23 of an elastic body used as an anti-vibratory measure would be warped, causing an angular deviation of the electro-optical device 17, as a problem.

FIG. 4(a) illustrates a state being free of vibrations, like that in FIG. 3(a). In FIG. 4(b), the electro-optical device 17 is given an external vibration, and displaced from the state, making a translational movement, where it is allowed to hold an attitude perpendicular to the optical axis L. Therefore, if the electro-optical device 17 is displaced by a transitional movement due to vibration as illustrated in FIG. 4(b), then flux of light passing through the electro-optical device 17 can strike into the opening placed in the prescribed position, to be detected by a device in a subsequent stage, thus allowing for an accurate voltage measurement in the optical voltage measuring apparatus 2.

As described, given vibrations to devices 14-19, the optical voltage measuring apparatus 2 might suffer from an optical axis deviation as a hindrance against accurate voltage measurements, while it might have devices 14-19 displaced by a translational movement, where it would hardly be affected by vibrations, as a characteristic point.

However, for the method of adhesion bonding the devices 14 to 19 by the adhesive 23 onto the base plate 25 being flat in shape, it was difficult to predict in which directions the devices 14 to 19 would move, so it was disabled to control moving directions. Accordingly, for instance, for provision of an anti-vibratory measure including the devices 14 to 19 adhesion-bonded onto the base plate 25, enabled was no more than suppressing the thickness of adhesive 23 to a minimized permissible thickness to keep the devices 14 to 19 from being inclined by vibration, thus failing to implement a sufficient anti-vibratory measure, as a problem.

PRIOR TECHNICAL DOCUMENT

Patent document

Patent document 1: Japanese Patent Application Laid-open Publication No. 2003-14790

SUMMARY OF THE INVENTION

Object to be Solved by the Invention

In view of the problems described, the present invention provides an optical voltage sensor having applications to optical voltage measuring apparatuses, allowing for a high precision, stable voltage measurement even under a condition where it may undergo large vibrations.

Means for Solving the Object

According to an aspect of the present invention, an optical voltage sensor comprises a polarizing optical system disposed perpendicular to an optical axis of incoming light from a light source, having the optical axis as a center axis thereof, and configured for polarization of incoming light to a prescribed reference state, an electro-optical device disposed perpendicular to the optical axis, having the optical axis as a center axis thereof, and adapted, as a voltage to be measured is imposed thereon, to respond to the imposed voltage by polarizing light polarized by the polarizing optical system, and an analyzer disposed perpendicular to the optical axis, having the optical axis as a center axis thereof, and adapted, as light polarized by the electro-optical device is input thereto, to output to a detector.

Effects of the Invention

The present invention allows for a high precision, stable voltage measurement even under a condition where large vibrations may occur.

BEST MODE FOR CARRYING OUT THE INVENTION

There will be described an optical voltage sensor according to an embodiment as the best mode of the present invention, with reference to the drawings.

Figure 5:
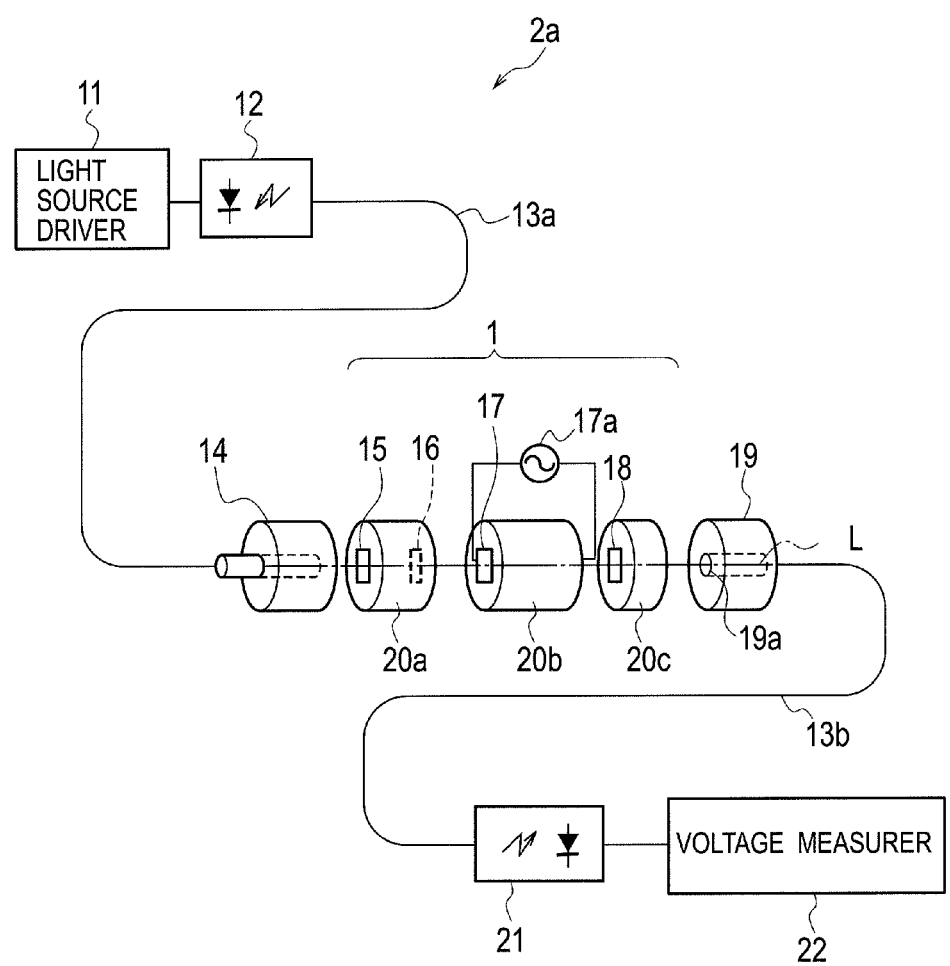
FIG. 5 is a diagram for describing configuration of an optical voltage sensor according to the present invention, and an optical voltage measuring apparatus including the optical voltage sensor.

FIG. 5 illustrates an optical voltage sensor 1 according to the best embodiment of the present invention, which includes a combination of a polarizer 15 and a retardation plate 16, as a system of polarizing optical elements for polarizing incoming light, an electro-optical device 17 operable for modulation in phase of light polarized by the combination of polarizer 15 and retardation plate 16, in accordance with an imposed voltage 17a, and an analyzer 18 for detecting light transmitted through the electro-optical device 17. Further, the optical voltage sensor 1 includes frames 20a to 20c of cylindrical shapes open at both ends. The polarizer 15 is an element adapted for linear polarization of incoming light from a light sending collimator 14. And, the retardation plate 16 is an element adapted for circular polarization of light linear polarized by the polarizer 15, to produce reference light.

In the example illustrated in FIG. 5, the optical voltage sensor 1 is incorporated in an optical voltage measuring apparatus 2a. This optical voltage measuring apparatus 2a includes a light source driver 11, a light source 12 to be driven by the light source driver 11, an optical fiber 13a for conducting light emitted from the light source 12 to a light sending collimator 14, the light sending collimator 14 changing incoming light into parallel light to send to the polarizer 15 of the optical voltage sensor 1, a light receiving collimator 19 for receiving light transmitted through the analyzer 18 of the optical voltage sensor 1 and having passed an opening 19a, to change into parallel light, an optical fiber 13b for conducting incoming light from the light receiving collimator 19 to a detector 21, the detector 21 detecting incoming light from the optical fiber 13b, to convert into an electric signal, and a voltage measurer 22 for measuring the voltage imposed on the electro-optical device 17 from the electric signal the detector 21 has output after conversion.

The polarizer 15 is an element configured for linear polarizing incoming light, and the retardation plate 16 is a quarter-wave plate configured for circular polarizing light linear polarized by the polarizer. This combination of polarizer 15 and retardation plate 16 is adapted for polarization of light emitted from the light source 12 and input thereto through the light sending collimator 14, into a prescribed reference state. The polarizer 15 and the retardation plate 16 are rectangular parallelepiped elements secured in a cavity formed inside the frame 20a by an adhesive of an elastic body that absorbs external vibrations. The polarizer 15 and the retardation plate 16 are disposed perpendicular to an optical axis L of incoming light, having the optical light L as a center axis thereof.

The electro-optical device 17 is an electro-optical element (Pockels effect device) using a single crystal such as BGO ($Bi_{12}GeO_{20}$). The electro-optical device 17 is configured to use an electro-optical effect for modulation in phase of incoming light from the retardation plate 16 in accordance with a voltage imposed thereon as an object to be measured.

That is, the electro-optical device 17 is adapted to have a quantity of light elliptically polarized to change by an elliptic ratio commensurate with an imposed intensity of voltage, to output light by a light quantity in accordance with a voltage to be measured.

The electro-optical device 17 is shaped in the form of a rectangular parallelepiped like the polarizer 15 and the retardation plate 16, and secured in an internal space of the frame 20b by an adhesive of an elastic body that can absorb externally given vibrations. Also the electro-optical device 17 is disposed perpendicular to the optical axis L of incoming light, having the optical axis L as a center axis thereof. The electro-optical device 17 may be provided with electrodes to apply a voltage to be measured, to thereby polarize incoming light. Or alternatively, the electro-optical device 17 may be configured for polarization of incoming light by an electric field developed therearound.

The analyzer 18 is an element configured for detection of light having a light quantity changed by the electro-optical device 17 in accordance with a voltage to be measured. The analyzer 18 also is a rectangular parallelepiped similar to other elements 15 to 17, and secured in an internal space of the frame 20c by an adhesive of an elastic body that can absorb externally given vibrations. Also the analyzer 18 is disposed perpendicular to the optical axis L of incoming light, having the optical axis L as a center axis thereof.

In the example illustrated in FIG. 5, the light sending collimator 14 as well as the light receiving collimator 19 is cylindrical in shape, and the light sending collimator 14, the light receiving collimator 19, and the frames 20a to 20c have an identical diameter. Although in the example illustrated in FIG. 5 the light sending collimator 14, the frames 20a to 20c, and the light receiving collimator 19 are each respectively independently arranged, the light sending collimator 14, the frames 20a to 20c, and the light receiving collimator 19 are centered with respect to their axes as a reference to fix in a single cylindrical form.

It is noted that in the optical voltage measuring apparatus 2a, the voltage measurer 22 is adapted to compare a light quantity of light detected by the detector 21 with a light quantity of light emitted by the light source 12, for determination of a loss of light quantity at the electro-optical device 17 that is commensurate with a voltage to be measured, to thereby measure the voltage imposed on the electro-optical device 17. That is, the voltage measurer 22 is adapted to employ a quantity of light output from the light source and a state of light polarized by the combination of polarizer 15 and retardation plate 16 as a reference, to determine a voltage applied to the electro-optical device 17, from a quantity of light detected by the detector 21.

Figure 1:
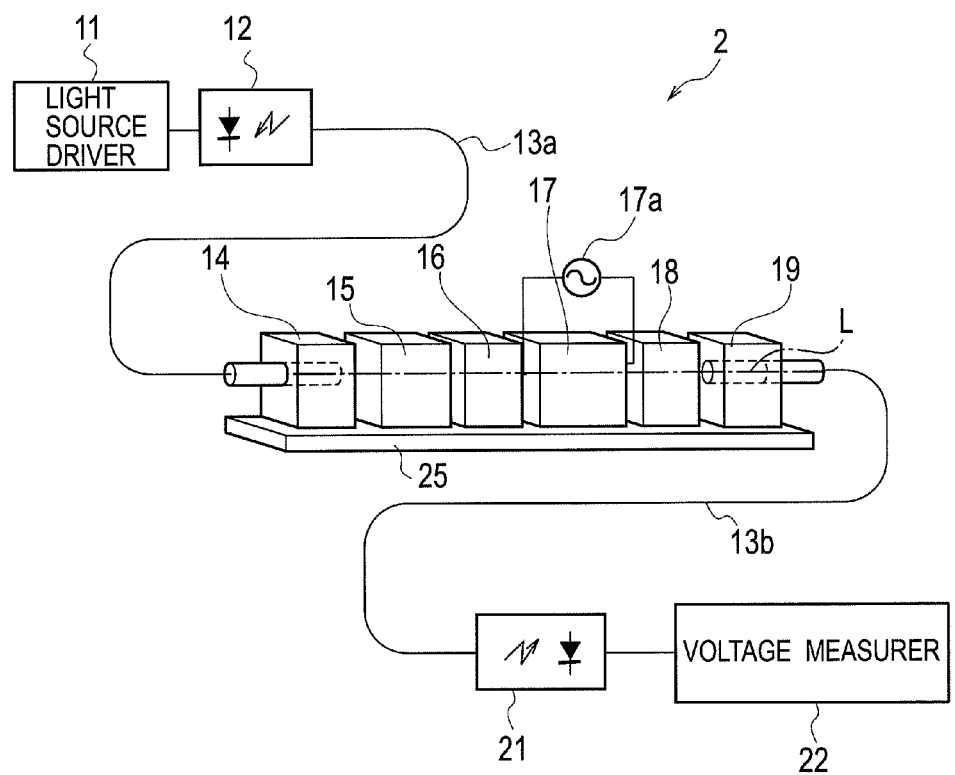
FIG. 1 is a functional block diagram showing configuration of a general optical voltage measuring apparatus.
Figure 2:
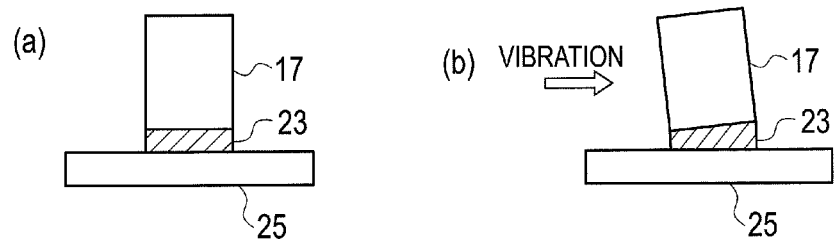
FIG. 2 provides illustrations of an example of fixation of a general electro-optical device.
Figure 6:
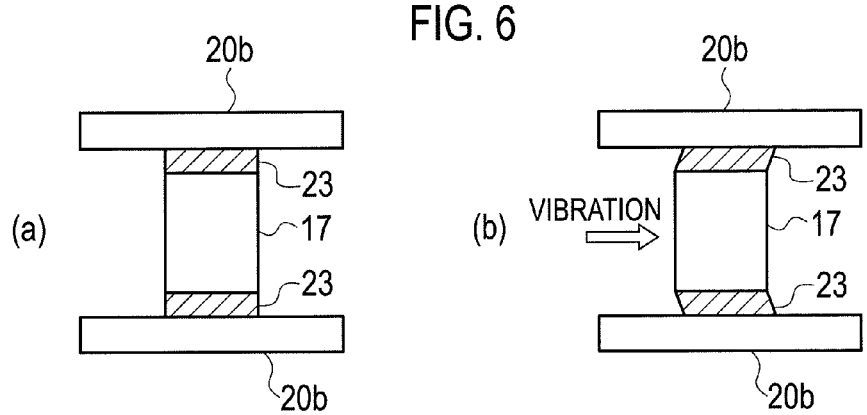
FIG. 6 provides illustrations of an example of fixation of an electro-optical device.

Referring now to FIG. 6, description is made of a method of using the adhesive 23 for bonding the electro-optical device 17 to the frame 20c. FIG. 6 is a sectional view of the electro-optical device 17 adhesion-bonded to the frame 20c, taken along the center axis of the electro-optical device 17. In the method described with reference to FIG. 2, the adhesion was onto base plate 25 flat-planer in shape. In this respect, according to the present invention, the optical voltage sensor 1 has the elements 15 to 18 adhesion-bonded to in voids formed in the cylindrical frames 20a to 20c as described with reference to FIG. 5, respectively. This is filled between the elements 15 to 18 and the frames 20a to 20c, with volumes of adhesive 23 of a vibration-absorbing elastic body, so the central axes of elements 15 to 18 coincide with central axes of frames 20a to 20c.

In the optical voltage sensor 1, the frames 20a to 20c, to which the elements 15 to 18 are bonded, may be shaped else than cylindrical as necessary to prevent vibrations, while they have most significant anti-vibratory effects when being cylindrical in shape. This reason will be described with reference to FIGS. 7 and 8.

Figure 7:
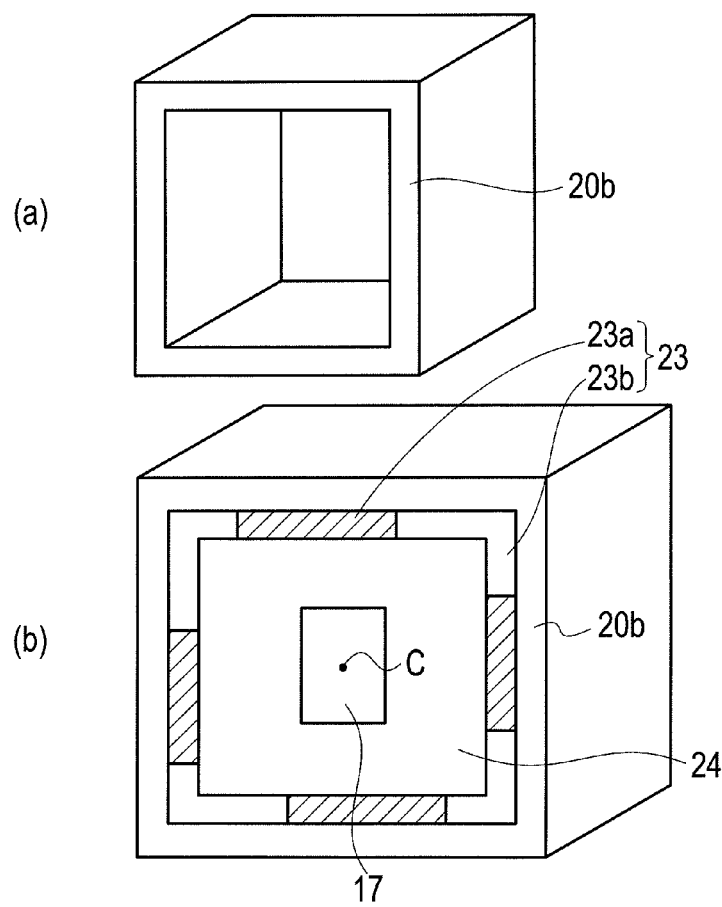
FIG. 7 provides illustrations for describing an example in which the electro-optical device is fixed in a rectangular parallelepiped frame.

FIG. 7 provides illustrations of the frame 20b assumed as a tubular rectangular parallelepiped, in which FIG. 7(a) represents a state before adhesion of the electro-optical device 17, and FIG. 7(b), a state after adhesion of the electro-optical device 17.

As illustrated in FIG. 7(a), the frame 20b has a space formed therein to arrange the electro-optical device 17. The electro-optical device 17 is disposed inside the frame 20c, and adhesion-bonded by the adhesive 23. In the illustration of FIG. 7(b), the electro-optical device 17 is fixed to a fixing frame 24, and the fixing frame 24 is adhesion-bonded to the frame 20b, while it is alike to have the electro-optical device 17 adhesion-bonded directly to the frame 20b. In this configuration, the electro-optical device 17 has its center axis coinciding with a center axis of the frame 20b, which center axis will be referred herein to as a center axis C.

Figure 3:
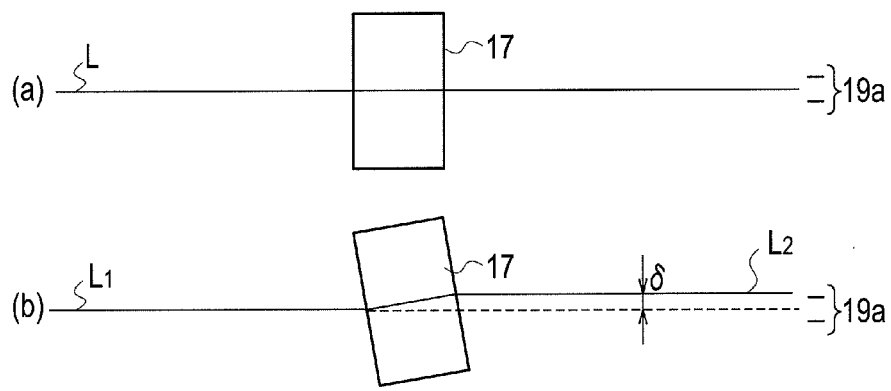
FIG. 3 provides illustrations of an example of incoming light striking into an electro-optical device given a vibration.
Figure 4:
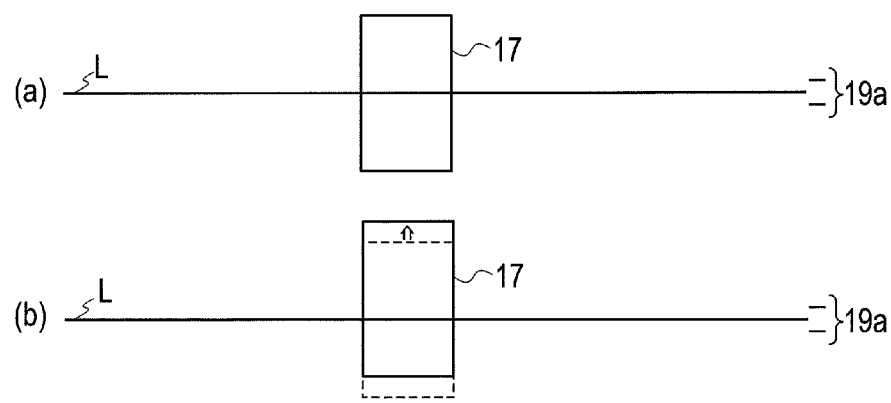
FIG. 4 provides illustrations of another example of incoming light striking into an electro-optical device given a vibration.

Like this, between the frame 20b and the electro-optical device 17 (the fixing frame 24 in the illustration of FIG. 7(b)) is filled with the adhesive 23 of elastic body, so that surrounding adhesive 23 can absorb externally given vibrations, preventing the electro-optical device 17 from being inclined, thus preventing angular deviations. In particular, in those cases in which, like the frame 20b illustrated in FIG. 7(b), assuming diagonal lines drawn from the center axis C as a reference to the frame 20b, line symmetry is observed at respective points on the frame 20b with respect to the center axis C, externally given vibrations are evenly absorbed by the adhesive 23, so angular motions that might incline the electro-optical device 17 would hardly be caused, thus allowing for an enhanced effect to prevent such an angular deviation as illustrated in FIG. 3(b).

However, the adhesion between the electro-optical device 17 and the frame 20b may be accompanied by, among others, intrusion of cavities or uneven cure regions, even after an even filling of adhesive 23 between the electro-optical device 17 and the frame 20b. As a result, there may be regions uneven in hardness of adhesive 23 by which the electro-optical device 17 is bonded to the frame 20b. Such being the case, the adhesive 23 may have regions uneven in hardness, so as illustrated in FIG. 7(b), it may be composed of soft portions 23a and hard portions 23b. Further, assuming the frame 20b as a rectangular parallelepiped, the cross section has a rectangular shape as illustrated in FIG. 7(b). In such a rectangular section of the frame 20b, the sides of frame 20b have points thereon at different distances from the center axis C, such that middle points of the sides of frame 20b are near to the center axis C, and vertices of frame 20b are far from the center axis C.

The adhesive 23 thus has soft portions 23a and hard portions 23b distributed, in addition to points on the frame 20b at different distances from the center axis C, whereby the adhesive 23 might fail to evenly absorb externally given vibrations. Accordingly, using a polygonal frame 20b would provide the electro-optical device 17 or like components with an increased tendency to rotate, with an increased tendency for angular deviations to occur.

On the other hand, if points on a frame 20b have an equalized distance to the center axis C, then binding forces against rotation would be substantially evenly distributed at both sides of the axis, even with provision of an adhesive 23 having soft portions 23a and hard portions 23b distributed. This would be effective in prevention against rotary actions of components such as electro-optical device 17, that is, against occurrence of angular deviation. Therefore, it is most preferable for the optical voltage sensor 1 to use cylindrical frames 20a to 20c, as illustrated in FIG. 5.

More specifically, the frame 20b used should be cylindrical in shape as illustrated in FIG. 8(a). As illustrated in FIG. 8(b), this frame 20b has therein a fixing frame 24 bonded thereto and configured for fixation of the electro-optical device 17. Like this, the cylindrical frame 20b in use permits distances from the center axis C to points on the frame 20b to be equalized. It is noted that the center axis X is arranged to be coincident with the optical axis L.

The electro-optical device 17 may be formed in a cylindrical shape to permit a direct adhesion of electro-optical device 17 to the frame 20b by an adhesive 23, without using the fixing frame 24. However, in most practical cases, it is easy to fabricate the electro-optical device 17 in a rectangular shape. Further, in some actual cases, the electro-optical device 17 and like components are available simply as products in a rectangular form. Therefore, the rectangular electro-optical device 17 is fixed to a cylindrical fixing frame 24, and afterwards, the fixing frame 24 is bonded by an adhesive 23 to the frame 20b, as described. It is noted that the bonding method between the electro-optical device 17 and the fixing frame 24 may be arbitrary subject to a secured fixation of the electro-optical device 17 to the fixing frame 24.

The polarizer 15, retardation plate 16, and analyzer 18 may well be likewise cylindrical in shape, to permit direct adhesion to the frames 20a and 20c by adhesive 23, without using fixing frames. On the other hand, if cylindrical elements 15, 16, and 18 are unavailable, rectangular elements 15, 16, and 18 may well be fixed to cylindrical fixing frames to be bonded to the frames 20a and 20b, respectively.

Figure 8:
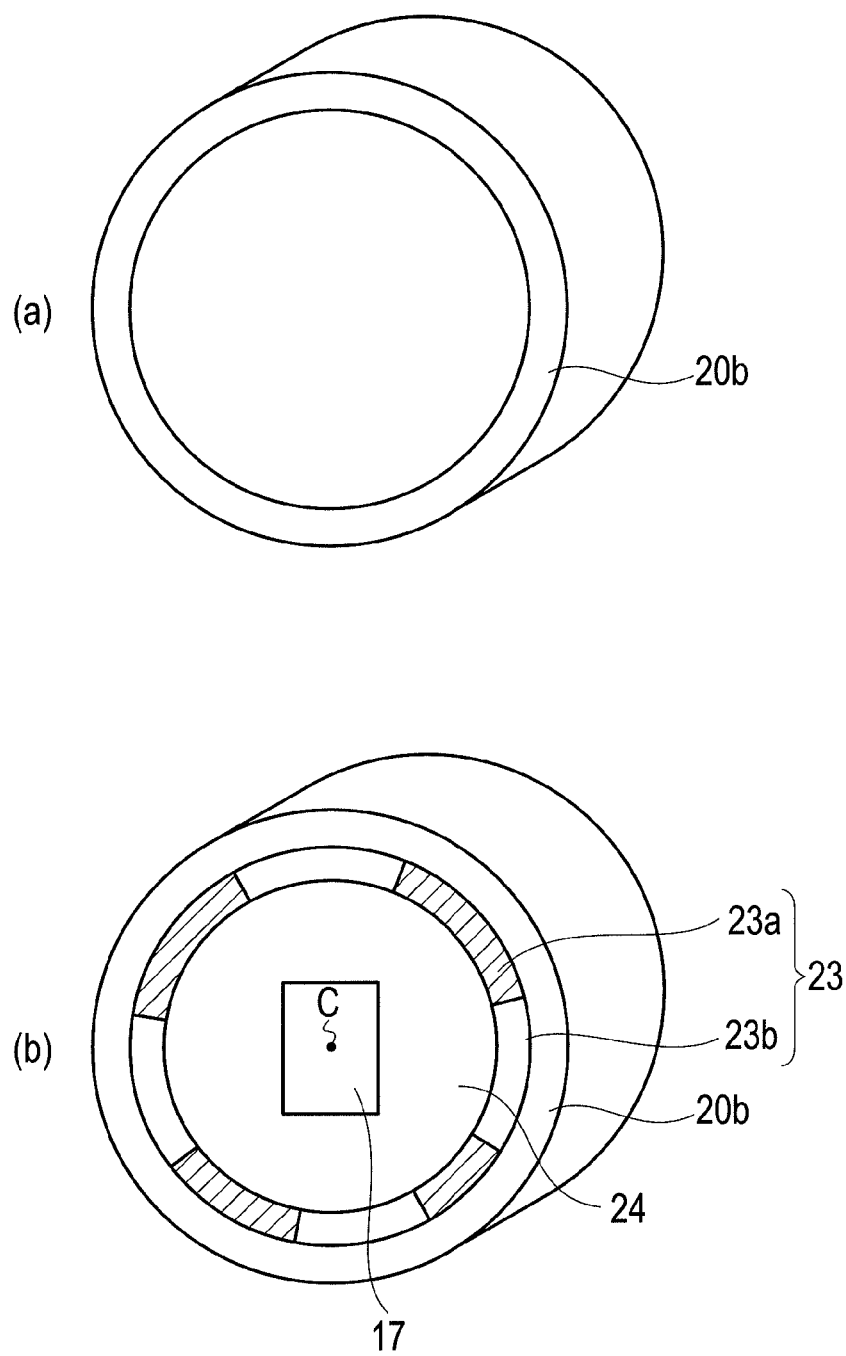
FIG. 8 provides illustrations for describing an example in which the electro-optical device is fixed in a cylindrical frame.
Figure 9:
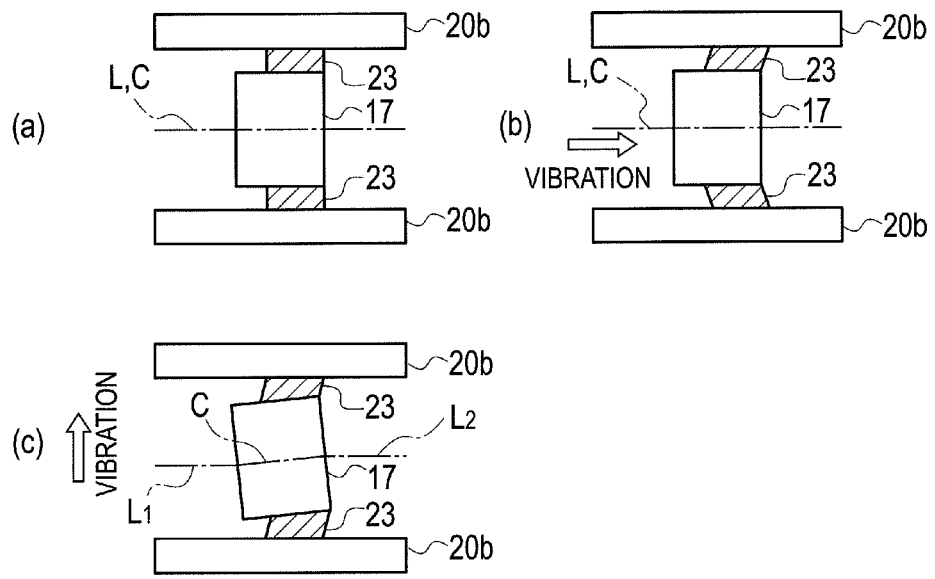
FIG. 9 provides illustrations for describing an optical axis deviated by vibrations.

Referring now to FIG. 9, description is made of the electro-optical device 17 secured by an adhesive 23 to the frame 20b as illustrated in FIG. 8, in regard of relationships it has to vibration directions. In FIG. 9, the fixing frame 24 shown in FIG. 8 is omitted for description. The electro-optical device 17 is secured within the frame 20b, with the adhesive 23 in between, having the optical axis L coincident with the center axis C of electro-optical device 17 and frame 20b, in an axisymmetric configuration about the center axis C.

As illustrated in FIG. 9(a), in a state free of vibrations, the optical axis L is set perpendicular to the electro-optical device 17, and coincident with the center axis C of electro-optical device 17.

As illustrated in FIG. 9(b), if a vibration acts in a sense of the optical axis to a state secured as illustrated in FIG. 9(a), then the electro-optical device 17 is moved in a direction parallel to the optical axis L, without being inclined. Accordingly, even if given any vibration in any sense of the optical axis, the electro-optical device 17 simply makes a translational movement, so the optical axis L remains perpendicular to the electro-optical device 17, and coincident with the center axis C of electro-optical device 17.

On the other hand, as illustrated in FIG. 9(c), if a vibration acts in a perpendicular direction to the optical axis L, then the electro-optical device 17 may be inclined. In such a case, incoming light obliquely strikes on the electro-optical device 17, thus having an optical axis L1 of incoming light an optical axis L2 of outgoing light disaccord with each other, the optical axes L1 and L2 being disaccord with the center axis C, either.

It therefore is necessary in installation of the optical voltage measuring apparatus including the optical voltage sensor 1, to implement an arrangement to a position grasped in advance as a source of vibration, so as to orient acting directions to elements 14 to 19 to an optical axis direction.

Description is now made of ideal thickness of an adhesive 23 for adhesion of elements 15 to 18. For an optical voltage sensor 1 including an adhesive 23 made of an elastic body, there has been a thickness of the elastic body suppressed to a minimum, as necessary, with a concern about an increase in angular deviation due to vibration of electro-optical device 17 as described with reference to FIG. 2(b). However, as having been described with reference to FIGS. 7 and 8, according to the present invention, the optical voltage sensor 1 is configured with an optical axis coincident with a center axis C, and an electro-optical device 17 secured by adhesion in a frame 20b so as to be axisymmetric about the center axis C, so the thicker the adhesive 23 as an elastic body is made the more the angular deviation can be suppressed.

The optical voltage sensor 1 is to be provided in optical voltage measuring apparatuses for measurements to be made in electric power equipments, some of which will have breakers each installed therein for an instantaneous interruption of a high-voltage large current at the time of an accident. Those breakers have to be operated at high speeds to achieve a current interruption, and will produce large vibrations, reaching a 1,000 G as a maximum in some cases. Therefore, the optical voltage sensor 1 employable for voltage measurements in electric power equipments should be adapted for an accurate measurement even under a condition of 1,000 G vibration. For suppression of 1,000 G vibration, required is a thickness of adhesive 23 to be at least 0.5 mm, as will be determined by an expression 1 below. That is, the adhesive 23 should have a thickness of 0.5 mm or more to cope with vibrations causing amplitudes to range up to 0.5 mm or near. The expression 1 is given, letting D be a displacement by vibration, G be an acceleration of vibration [G], and F be a frequency of vibration [Hz].

$$D = G \cdot 500/F^2 \qquad (1)$$

The vibration frequency is about 1 kHz, and when a vibration of 1,000 G is acting, the vibration amplitude comes to 0.5 mm. To absorb such a vibration, the adhesive 23 made of a typical rubber or the like needs a thickness exceeding the vibration amplitude. Accordingly, it is optimal to provide the adhesive 23 with a thickness of 0.5 or more.

If the thickness is thinner, the adhesive 23 will lose the elasticity, thus failing to absorb vibrations. Further, the lost of elasticity may occur at dispersed timings on both sides of the center axis, constituting a cause of angular deviation. Therefore, for prevention of angular deviation also, the adhesive 23 should have a sufficient thickness secured.

According to the present invention, the optical voltage sensor 1 has the elements 15 to 18 adhesion-bonded by adhesive 23 within hollows of the frames 20a to 20c, as described. Therefore, the optical voltage sensor 1 is adapted for absorption of externally given vibrations by adhesive 23, to prevent vibrations from affecting. Although in the foregoing description the elements 15 to 18 are individually arranged inside the frames 20a to 20c, and the frames 20a to 20c are fixed to a single tubular form, all the elements 15 to 18 may be arranged in a single tubular frame to achieve an equivalent effect.

Further, the optical voltage sensor 1 has the frames 20a to 20c formed in a tubular shape, in particular, in a cylindrical shape axisymmetric about the center axes, allowing for an enhanced anti-vibratory effect.

Further, the optical voltage sensor 1 has the adhesive 23 made of an elastic body 0.5 mm or more thick, thereby permitting absorption of given vibrations, even when they are 1,000 G. vibrations.

(Modification)

Figure 10:
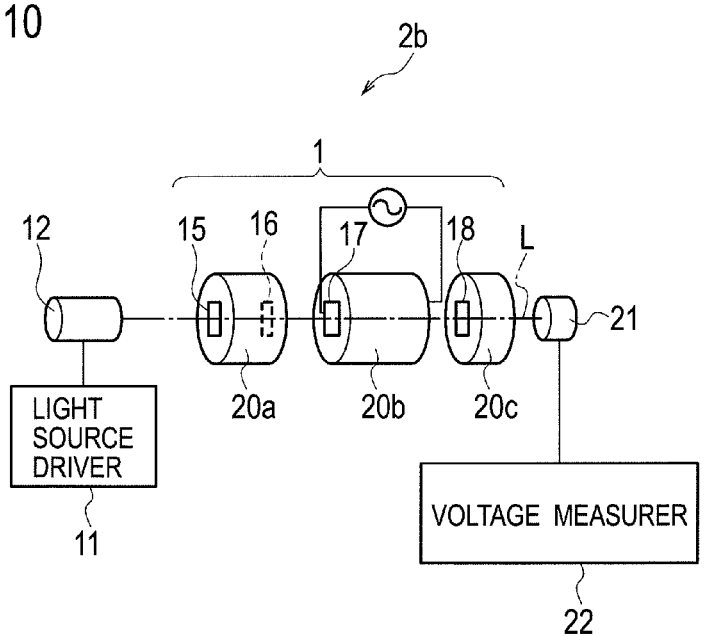
FIG. 10 is a diagram for describing configuration of an optical voltage measuring apparatus according to a modification.

Referring now to FIG. 10, description is made of an optical voltage measuring apparatus using an optical voltage sensor 1 according to a modification.

As illustrated in FIG. 10, according to the modification, the optical voltage measuring apparatus 2b excludes the optical fibers 13a and 13b, the light sending collimator 1r, and the light receiving collimator 19, unlike the optical voltage measuring apparatus 2b in FIG. 5. Accordingly, in the optical voltage measuring apparatus 2b, flux of light emitted at a light source 12 is directly introduced to a polarizer 15, and flux of light detect at an analyzer 18 is directly introduced to a detector 21, while other elements are left as they are, and redundant description is omitted.

The optical voltage measuring apparatus 2b has no optical fibers for transmission of light, and is adapted for voltage measurements free of considerations to loss of light. Further, the optical voltage measuring apparatus 2b excluding optical fibers, light sending collimator, and light receiving collimator can be compact in configuration. Therefore, the optical voltage measuring apparatus 2b is advantageous in adaptation for close arrangement of the light source 12 and the detector 21 to other elements 14 to 19.

Such being the case, the optical voltage sensor 1 has applications to various apparatuses and systems making use of light for voltage measurement, encompassing also those else than the optical voltage measuring apparatus 2a described with reference to FIG. 5.

Description Of Reference Characters 2a, 2b . . . optical voltage measuring apparatus
1 . . . optical voltage sensor
11 . . . light source driver
12 . . . light source
13a, 13b . . . optical fiber
14 . . . light sending collimator
15 . . . polarizer (polarizing optical system)
16 . . . retardation plate (polarizing optical system)
17 . . . electro-optical device
18 . . . analyzer
19 . . . light receiving collimator
19a . . . opening
20a to 20c . . . frame
21 . . . detector
22 . . . voltage measurer
23 . . . adhesive

The invention claimed is:

1. An optical voltage sensor, comprising:
a polarizing optical system disposed perpendicular to an optical axis of incoming light from a light source, having the optical axis as a center axis thereof, and configured for polarization of incoming light to a prescribed reference state;
an electro-optical device disposed perpendicular to the optical axis, having the optical axis as a center axis thereof, and adapted, as a voltage to be measured is imposed thereon, to respond to the imposed voltage by polarizing light polarized by the polarizing optical system; and
an analyzer disposed perpendicular to the optical axis, having the optical axis as a center axis thereof, and adapted, as light polarized by the electro-optical device is input thereto, to output the light polarized by the electro-optical device to a connected detector; and
frames shaped cylindrical and hollow-tubular,
wherein the polarizing optical system, the electro-optical device, and the analyzer are respectively secured inside hollows of the frames with elastic bodies in between,
the elastic bodies include soft portions and hard portions distributed in the elastic bodies, and
the center axes of the polarizing optical system, the electro-optical device, and the analyzer coincide with a straight line formed by center axes of the frames.

2. The optical voltage sensor according to claim 1, wherein the polarizing optical system, the electro-optical device, and the analyzer are arranged to have a direction of the optical axis extending along a direction of a displacement of the optical voltage sensor caused by an external vibration.

* * * * *